United States Patent
Zhong et al.

(10) Patent No.: US 10,743,635 B2
(45) Date of Patent: Aug. 18, 2020

(54) LIQUID EYELINER PEN HAVING LIQUID STORAGE FUCTION

(71) Applicant: SHYA HSIN PACKAGING INDUSTRY(CHINA) CO., LTD., Kunshan (CN)

(72) Inventors: Hua Zhong, Kunshan (CN); Linglang Zhan, Kunshan (CN)

(73) Assignee: SHYA HSIN PACKAGING INDUSTRY (CHINA) CO., LTD., Kunshan (CN)

( * ) Notice: Subject to any disclaimer, the term of this patent is extended or adjusted under 35 U.S.C. 154(b) by 28 days.

(21) Appl. No.: 16/327,346

(22) PCT Filed: Nov. 3, 2016

(86) PCT No.: PCT/CN2016/104482
§ 371 (c)(1),
(2) Date: Feb. 22, 2019

(87) PCT Pub. No.: WO2018/035972
PCT Pub. Date: Mar. 1, 2018

(65) Prior Publication Data
US 2019/0246767 A1 Aug. 15, 2019

(30) Foreign Application Priority Data
Aug. 25, 2016 (CN) .......................... 2016 1 0723993

(51) Int. Cl.
*A45D 34/04* (2006.01)
*A45D 40/20* (2006.01)
(Continued)

(52) U.S. Cl.
CPC .......... *A45D 34/042* (2013.01); *A45D 40/20* (2013.01); *B43K 8/04* (2013.01); *F16J 15/3228* (2013.01);
(Continued)

(58) Field of Classification Search
CPC .......... A45D 34/042; B43K 5/18; B43K 7/01; B43K 7/10; B43K 8/04; B43K 8/08; B43K 8/12; B43K 8/143
See application file for complete search history.

(56) References Cited

U.S. PATENT DOCUMENTS

| 5,551,789 A * | 9/1996 | Okawa | A45D 34/042 401/199 |
| 6,602,012 B2 * | 8/2003 | Furukawa | B43K 8/04 401/223 |

(Continued)

FOREIGN PATENT DOCUMENTS

| CN | 204561273 U | 8/2015 |
| CN | 204561275 U | 8/2015 |

(Continued)

*Primary Examiner* — David P Angwin
*Assistant Examiner* — Bradley S Oliver
(74) *Attorney, Agent, or Firm* — Bayramoglu Law Offices LLC

(57) ABSTRACT

A liquid eyeliner pen having a liquid storage function includes a brush sleeve having a brush sleeve body. At least one air inlet hole extending along an axial direction of the brush sleeve body is configured on the brush sleeve body at a position close to the front shaft end thereof in a through manner. The front side of the air inlet hole is exposed outside a brush sleeve base. At least one first air vent extending along the axial direction of the brush sleeve body is further configured on the outer layer sidewall of the brush sleeve body. A front side of the first air vent intercommunicates with the air inlet hole, a rear side of the first air vent intercommunicates with a second air vent on the diverter base. At least one liquid storage groove unit is configured on the inner layer sidewall of the brush sleeve body.

8 Claims, 3 Drawing Sheets

(51) Int. Cl.
  *B43K 8/04* (2006.01)
  *A46B 11/00* (2006.01)
  *F16J 15/3228* (2016.01)
  *F16J 15/3252* (2016.01)

(52) U.S. Cl.
  CPC ... *F16J 15/3252* (2013.01); *A45D 2200/1072* (2013.01); *A46B 11/00* (2013.01); *A46B 2200/30* (2013.01)

(56) References Cited

U.S. PATENT DOCUMENTS

| | | | |
|---|---|---|---|
| 6,702,498 B2 * | 3/2004 | Konose | B43K 8/04 401/198 |
| 7,938,592 B2 * | 5/2011 | Tamano | B43K 8/04 401/223 |
| 9,498,044 B2 * | 11/2016 | Chen | A45D 34/042 |
| 9,796,207 B2 * | 10/2017 | Kawasaki | B43K 8/04 |
| 9,889,701 B2 * | 2/2018 | Fukumoto | B43K 8/08 |
| 9,969,205 B2 * | 5/2018 | Kawasaki | B43K 8/04 |

FOREIGN PATENT DOCUMENTS

| | | |
|---|---|---|
| CN | 204908373 U | 12/2015 |
| CN | 205162264 U | 4/2016 |
| CN | 206043802 U | 3/2017 |
| JP | H11139470 A | 5/1999 |

\* cited by examiner

LIQUID EYELINER PEN HAVING LIQUID STORAGE FUCTION

CROSS REFERENCE TO THE RELATED APPLICATIONS

This application is the national phase entry of International Application No. PCT/CN2016/104482, filed on Nov. 3, 2016, which is based upon and claims priority to Chinese Patent Application No. 201610723993.4, filed on Aug. 25, 2016, the entire contents of which are incorporated herein by reference.

TECHNICAL FIELD

The present invention relates to the technical field of liquid eyeliner pen, and particularly to a liquid eyeliner pen having a liquid storage function.

BACKGROUND

With the economic development and the improvement of people's living standards, people are paying more and more attention to their own image and health, especially for women, the probability and frequency of using cosmetics is increasing. Eyelash brush, eyeliner, lip brush, etc. are commonly used cosmetics by women.

However, the use of the eyeliner pen currently available is often affected by temperature and instable air pressure, thereby affecting the discharge amount of the brush, and making the discharge of the brush unstable.

To this end, the present invention is hereby proposed.

SUMMARY

In order to overcome the above drawbacks, the present invention provides a liquid eyeliner pen having a liquid storage function, which can effectively ensure the discharge stability of the brush.

In order to solve the technical problems, the present invention uses the following technical solutions. A liquid eyeliner pen with a liquid storage function, includes a container assembly configured to contain an eyeliner liquid, an applying assembly configured to draw the eyeliner liquid to flow out and apply the eyeliner liquid onto the user's face, and a cap assembly. The applying assembly includes a brush sleeve base, a brush sleeve, a diverter base, a coupling, a liquid feeder, and a brush positioned and coupled to a shaft end of the liquid feeder. The brush sleeve base, the brush sleeve, the diverter base and the coupling are arranged coaxially, and are all sleeve-shaped structures with openings at both ends of an axial direction. A rear shaft end of the brush sleeve and a front shaft end of the coupling are correspondingly positioned and inserted into a front shaft end and a rear shaft end of the brush sleeve base, respectively. The diverter base is configured inside the brush sleeve base and is located between the brush sleeve and the coupling. Also, two ends of the diverter base in the axial direction respectively abut against a rear shaft end of the brush sleeve and a front shaft end of the coupling. In addition, the brush sleeve, the diverter base, and the coupling further collectively form an accommodating cavity. The liquid feeder and the brush are coaxially positioned and inserted into the accommodating cavity. A part of the brush further extends outside a front shaft end of the brush sleeve. A round of first protruding edge radially extending outward is formed on an outer sidewall of the brush sleeve base. The first protruding edge divides the brush sleeve base into a first portion corresponding to the coupling and a second portion corresponding to the brush sleeve. The first portion of the brush sleeve base is inserted into the container assembly and is detachably positioned and coupled with the container assembly. The cap assembly is detachably sleeved outside the second portion of the brush sleeve base. The liquid eyeliner pen is characterized in that the brush sleeve has a brush sleeve body. The brush sleeve body is a sleeve-shaped structure with openings at both ends in the axial direction. At least one air inlet hole extending along the axial direction of the brush sleeve body and running through the brush sleeve body is configured on the brush sleeve body at a position close to the front shaft end thereof. A front side of the air inlet hole is exposed outside the brush sleeve base. At least one first air vent extending along the axial direction of the brush sleeve body is further formed on an outer layer sidewall of the brush sleeve body. A front side of the first air vent intercommunicates with the air inlet hole. A rear side of the first air vent intercommunicates with a second air vent on the diverter base.

In addition, at least one liquid storage groove unit is configured on an inner layer sidewall of the brush sleeve body. Each liquid storage groove unit is composed of a plurality of arc-shaped liquid storage grooves extending along a circumferential direction of the brush sleeve body. The plurality of arc-shaped liquid storage grooves of each liquid storage groove unit are further arranged along the axial direction of the brush sleeve body at intervals.

As a further improvement of the present invention, two liquid storage groove units are provided; and the plurality of arc-shaped liquid storage grooves of the two liquid storage groove units are symmetrically distributed around an axis of the brush sleeve body.

Two air inlet holes are provided, and the two air inlet holes are matched with the two liquid storage groove units in a one-to-one correspondence. A rear side of each air inlet hole extends to a front side of a corresponding liquid storage groove unit.

As a further improvement of the present invention, two sides in a circumferential direction of each liquid storage groove unit are respectively configured with an air vent. Front sides of the two air vents both intercommunicate with the air inlet holes corresponding to the liquid storage groove unit. Rear sides of the two air vents both intercommunicate with the second air vent on the diverter base.

Further, an arc-shaped intercommunicating hole extending along the circumferential direction of the brush sleeve body is further provided on the brush sleeve body at a position of a rear side of each liquid storage groove unit in a through manner. A rear side of each air vent intercommunicates with a corresponding arc-shaped intercommunicating hole. In addition, two cuttings are provided on the rear shaft end of the brush sleeve body. The two cuttings are matched with the two arc-shaped intercommunicating holes in a one-to-one correspondence, and the two cuttings are intercommunicated with the arc-shaped intercommunicating holes.

As a further improvement of the present invention, portions of the outer layer sidewall of the brush sleeve body located between the two air inlet holes further radially extend outward to form an arc-shaped second protruding edge. Two of the second protruding edges are located on a same radial plane, and both of the two second protruding edges are capable of externally abutting the end surface of the front shaft of the brush sleeve base.

As a further improvement of the present invention, the diverter base has a diverter base body. The diverter base body is also a sleeve-shaped structure with openings at both ends in the axial direction. A plurality of annular grooves extending along a circumferential direction of the diverter base body are configured on an outer layer sidewall of the diverter base body. The plurality of the annular grooves are further arranged at equal intervals along an axial direction of the diverter base body. Further, a second air vent extending along an axial direction of the diverter base body is configured on the outer layer sidewall of the diverter base body. The second air vent further correspondingly intercommunicates with one of the cuttings.

In addition, a part of the annular grooves and the second air vent further intercommunicate with an inner cavity of the diverter base body.

As a further improvement of the present invention, the container assembly includes an outer bottle body, an inner bottle body and an inner stopper. The outer bottle body is a cylindrical structure with an opening at a front shaft side. The inner bottle body is a sleeve-shaped structure with openings on both sides in an axial direction. The inner stopper is hermetically connected to the opening at a rear shaft side of the inner bottle body. The inner bottle body and the inner stopper are coaxially and freely inserted into the outer bottle body.

In addition, the first portion of the brush sleeve base is inserted into the outer bottle body and is screwed with the outer bottle body. Also, the rear shaft end of the coupling is further tightly inserted into the opening at the front shaft side of the inner bottle body.

As a further improvement of the present invention, the cap assembly includes an outer cover, an inner sleeve, and a spring. The outer cover and the inner sleeve are both sleeve-shaped structures that are closed on the front shaft side and open on the rear shaft side. The inner sleeve and the spring are both provided inside the outer cover. An end of the spring is further sleeved on an inner surface of the front shaft side of the outer cover. Another end of the spring is further sleeved on the front shaft side of the inner sleeve.

In addition, a part of an outer sidewall of the inner sleeve at a position close to the front shaft side thereof radially extends outward to form a round of fourth protruding edge. An inner sidewall of the outer cover radially extends inward to form a round of first protrusion. The first protrusion can stop and block the fourth protruding edge.

As a further improvement of the present invention, the outer cover is sleeved outside the second portion of the brush sleeve base and is engaged with the second portion of the brush sleeve base. Also, the front shaft side of the brush sleeve base further extends into the inner sleeve and abuts against the inner sidewall of the inner sleeve.

The present invention has the following advantages. Compared with the prior art, according to the present invention, the structure of the brush sleeve is improved. In one aspect, a first air vent and an air inlet hole passing through the inner cavity of the brush sleeve body are configured on the brush sleeve body. The first air vent further intercommunicates with the air inlet hole and a second air vent arranged on the diverter base, respectively. Therefore, the air can enter the inner bottle body through the "air inlet hole, the first air vent, the arc-shaped intercommunicating hole, the cuttings, the second air vent, the inner cavity of the diverter base, the inner cavity of the coupling, and the liquid inlet hole", so as to have the same pressure at the inside and outside of the liquid eyeliner pen. In this way, during the use, the eyeliner liquid can flow into the brush under the action of gravity which makes the discharge of the brush stable. In a second aspect, at least one liquid storage groove unit is configured on the inner layer sidewall of the brush sleeve body. Each liquid storage groove unit is composed of a plurality of arc-shaped liquid storage grooves which extend along the circumferential direction of the brush sleeve body. The plurality of arc-shaped liquid storage grooves of each liquid storage groove unit are further arranged along the axial direction of the brush sleeve body at intervals. Therefore, when a large amount of eyeliner liquid is discharged, the redundant eyeliner liquid can be stored in the arc-shaped liquid storage grooves. When the discharge amount of the brush is insufficient, the eyeliner liquid stored in the liquid storage grooves is supplied to the brush, thereby greatly ensuring the discharge stability of the brush.

The following description is made with reference to the drawings.

1—container assembly; 10—outer bottle body;
11—inner bottle body; 12—inner stopper;
2—applying assembly; 20—brush sleeve base;
21—brush sleeve; 22—diverter base;
23—coupling; 24—liquid feeder;
25—brush; 200—first protruding edge;
210—brush sleeve body; 211—air inlet hole;
212—first air vent; 213—arc-shaped liquid storage groove;
214—arc-shaped intercommunicating hole; 215—cutting;
216—second protruding edge; 220—annular groove;
230—liquid inlet hole; 231—third protruding edge;
3—cap assembly; 30—outer cover;
31—inner sleeve; 32—spring.

DETAILED DESCRIPTION OF THE EMBODIMENTS

A preferred embodiment of the present invention will be described in detail below with reference to the drawings. However, the scope of the present invention is not limited to the following embodiments. Namely, any simple equivalent variation and modification based on the contents in scope of the patent application of the present invention and the specification still fall within the scope of the present invention.

Figure 1:
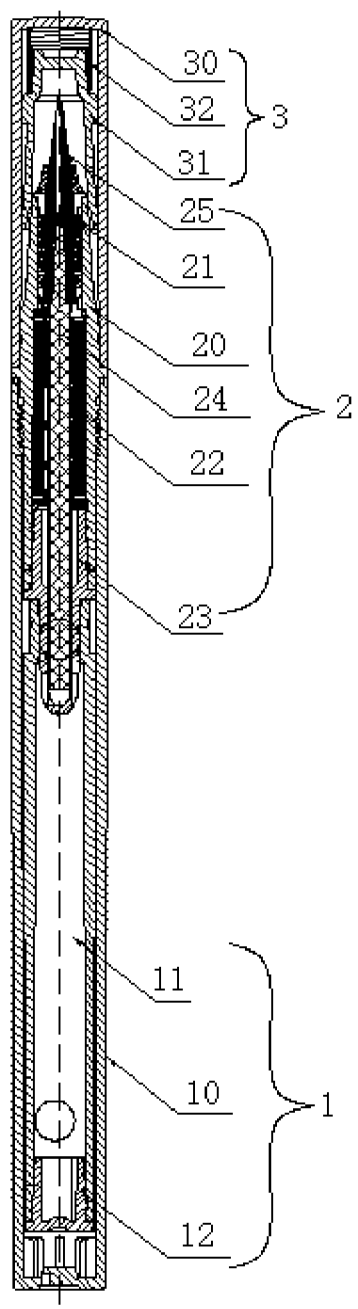
FIG. 1 is a structural schematic diagram of a liquid eyeliner pen according to the present invention.

Embodiment 1:

Referring to FIG. 1, i.e. a structural schematic diagram of a liquid eyeliner pen according to the present invention, the liquid eyeliner pen includes a container assembly 1 configured to contain an eyeliner liquid, an applying assembly 2 configured to draw the eyeliner liquid to flow out and apply the eyeliner liquid onto the user's face, and a cap assembly 3. The applying assembly 2 includes a brush sleeve base 20, a brush sleeve 21, a diverter base 22, a coupling 23, a liquid feeder 24, and a brush 25 positioned and coupled to a shaft end of the liquid feeder 24. The brush sleeve base 20, the brush sleeve 21, the diverter base 22, and the coupling 23 are coaxially arranged, and are all sleeve-shaped structures with openings at both ends of the axial direction. The rear shaft end of the brush sleeve 21 and the front shaft end of the coupling 23 are correspondingly positioned and inserted into the front shaft end and the rear shaft end of the brush sleeve base 20, respectively. The diverter base 22 is configured inside the brush sleeve base 20 and is located between the brush sleeve 21 and the coupling 23. Also, the two ends of the diverter base 22 in the axial direction respectively abut against the rear shaft end of the brush sleeve 21 and the front shaft end of the coupling 23. In addition, the brush sleeve 21, the diverter base 22, and the coupling 23 further collectively form an accommodating cavity. The liquid feeder 24 and the brush 25 are coaxially positioned and inserted into the accommodating cavity. A part of the brush 25 further extends outside the front shaft end of the brush sleeve 21. The outer sidewall of the brush sleeve base 20 radially extends outward to form a round of first protruding edge 200. The first protruding edge 200 divides the brush sleeve base 20 into a first portion corresponding to the coupling 23 and a second portion corresponding to the brush sleeve 21. The first portion of the brush sleeve base 20 is inserted into the container assembly 1 and is detachably positioned and coupled with the container assembly 1. The cap assembly 3 is detachably sleeved outside the second portion of the brush sleeve base 20. The brush sleeve 21 has a brush sleeve body 210, and the brush sleeve body 210 is a sleeve-shaped structure with openings at both ends of the axial direction. At least one air inlet hole 211 extending along the axial direction of the brush sleeve body 210 and running through the brush sleeve body 210 is configured on the brush sleeve body 210 at a position close to the front shaft end thereof. The front side of the air inlet hole 211 is exposed outside the brush sleeve base 20. At least one first air vent 212 extending along the axial direction of the brush sleeve body 210 is further formed on the outer layer sidewall of the brush sleeve body 210. A front side of the first air vent 212 intercommunicates with the air inlet hole 211. A rear side of the first air vent 212 intercommunicates with a second air vent on the diverter base 22. In addition, at least one liquid storage groove unit is configured on the inner layer sidewall of the brush sleeve body 210. Each liquid storage groove unit is composed of a plurality of arc-shaped liquid storage grooves 213 extending along the circumferential direction of the brush sleeve body 210, and the plurality of arc-shaped liquid storage grooves 213 of each liquid storage groove unit are further arranged along the axial direction of the brush sleeve body 210 at intervals. Compared with the prior art, according to the present invention, the structure of the brush sleeve is improved. In one aspect, a first air vent and an air inlet hole passing through the inner cavity of the brush sleeve body are configured on the brush sleeve body. The first air vent further intercommunicates with the air inlet hole and a second air vent arranged on the diverter base, respectively. Therefore, the air can enter the inner bottle body through the "air inlet hole, the first air vent, the arc-shaped intercommunicating hole, the cuttings, the second air vent, the inner cavity of the diverter base, the inner cavity of the coupling, and the liquid inlet hole", so as to have the same pressure at the inside and outside of the liquid eyeliner pen. In this way, during the use, the eyeliner liquid can flow into the brush under the action of gravity which makes the discharge of the brush stable. In a second aspect, at least one liquid storage groove unit is configured on the inner sidewall of the brush sleeve body. Each liquid storage groove unit is composed of a plurality of arc-shaped liquid storage grooves which extend along the circumferential direction of the brush sleeve body. The plurality of arc-shaped liquid storage grooves of each liquid storage groove unit are further arranged along the axial direction of the brush sleeve body at intervals. Therefore, when a large amount of eyeliner liquid is discharged, the redundant eyeliner liquid can be stored in the arc-shaped liquid storage grooves. When the discharge amount of the brush is insufficient, the eyeliner liquid stored in the liquid storage grooves is supplied to the brush, thereby greatly ensuring the discharge stability of the brush. In addition, arc-shaped grooves extending along the circumferential direction of the brush sleeve are further formed on the outer layer sidewall of the brush sleeve body 210 at positions corresponding to the arc-shaped liquid storage grooves 213. The arc-shaped grooves are provided to facilitate the flow of air between the brush sleeve and the brush sleeve base.

Figure 3:
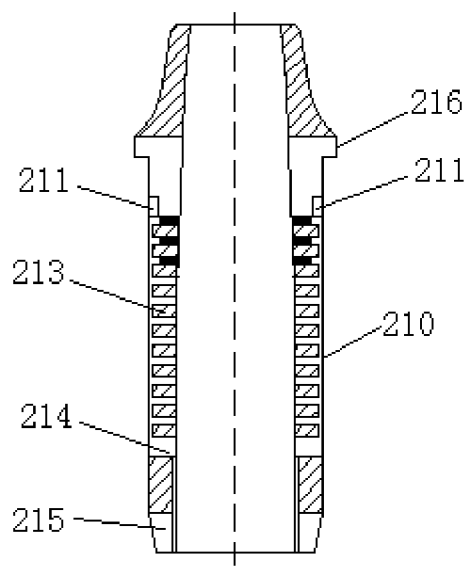
FIG. 3 is a structural schematic diagram showing a cross section of a brush sleeve according to the present invention at one viewing angle.
Figure 4:
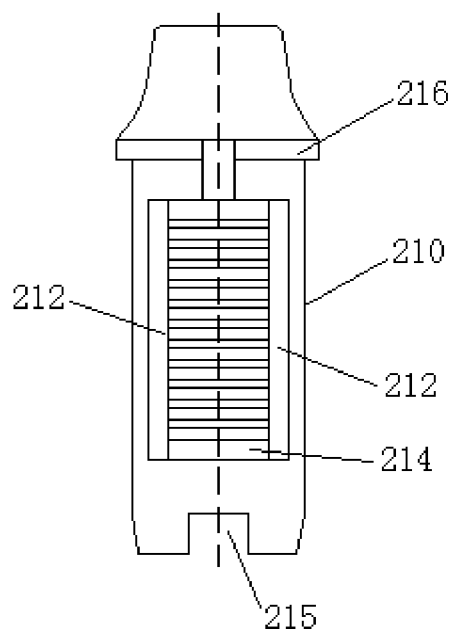
FIG. 4 is a structural schematic diagram showing a cross section of a brush sleeve according to the present invention at another viewing angle.

In this embodiment, as shown in FIGS. 3-4, two liquid storage groove units are provided. The plurality of arc-shaped liquid storage grooves 213 of the two liquid storage groove units are symmetrically distributed around the axis line of the brush sleeve body 210. Also, two air inlet holes 211 are provided, and the two air inlet holes 211 are matched with the two liquid storage groove units in a one-to-one correspondence. The rear side of each air inlet hole 211 extends to the front side of the corresponding liquid storage groove unit.

Preferably, an air vent 212 is respectively configured outside two sides in the circumferential direction of each liquid storage groove unit. The front sides of the two air vents 212 are both intercommunicate with the air inlet holes 211 corresponding to the liquid storage groove unit. The rear sides of the two air vents 213 both intercommunicate with the second air vents on the diverter base 22.

Further, an arc-shaped intercommunicating hole 214 extending along the circumferential direction of the brush sleeve body is further provided on the brush sleeve body 210 at a position of a rear side of each liquid storage groove unit in a through manner. A rear side of each air vent 212 intercommunicates with the corresponding arc-shaped intercommunicating hole 214 and further intercommunicates with the inner cavity of the brush sleeve. In addition, two cuttings 215 are configured on the rear shaft end of the brush sleeve body 210. The two cuttings 215 are matched with the two arc-shaped intercommunicating holes 214 in a one-to-one correspondence, and the two cuttings 215 are intercommunicated with the arc-shaped intercommunicating holes 214.

Further, preferably, portions of the outer layer sidewall of the brush sleeve body 210 located between the two air inlet holes 211 radially extend outward to form an arc-shaped second protruding edge 216. The two second protruding edges 216 are located on the same radial plane. Both of the two second protruding edges 216 are capable of abutting the end surface of the front shaft of the brush sleeve base 20.

Figure 2:
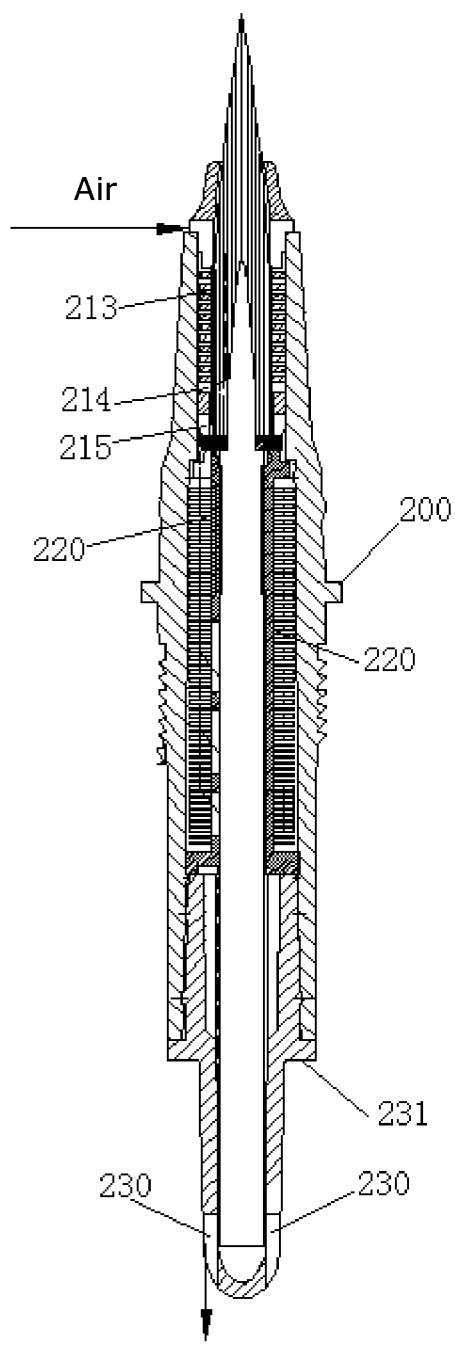
FIG. 2 is an enlarged structural schematic diagram of an applying assembly according to the present invention.

In this embodiment, as shown in FIG. 2, the diverter base 22 has a diverter base body. The diverter base body is also a sleeve-shaped structure with openings at both ends of the axial direction. A plurality of annular grooves 220 extending along the circumferential direction of the diverter base body are configured on the outer layer sidewall of the diverter base body. The plurality of the annular grooves 220 are further arranged at equal intervals along the axial direction of the diverter base body. Further, a second air vent axially extending along the diverter base body is configured on the outer layer sidewall of the diverter base body. The second air vent further corresponds to one of the cuttings 215. In addition, a part of the annular grooves 220 and the second air vent further intercommunicate with the inner cavity of the diverter base body, which can be realized by opening a through hole through the diverter base body.

In this embodiment, the container assembly 1 includes an outer bottle body 10, an inner bottle body 11, and an inner stopper 12. The outer bottle body 10 is a cylindrical structure with an opening at the front shaft side. The inner bottle body 11 is a sleeve-shaped structure with openings on both sides in the axial direction. The inner stopper 12 is hermetically connected to the opening at the rear shaft side of the inner bottle body 11. The inner bottle body 11 and the inner stopper 12 are further coaxially and freely inserted into the outer bottle body 10. In addition, the first portion of the brush sleeve base 20 is inserted into the outer bottle body 10 and is screwed with the outer bottle body 10. Meanwhile, the rear shaft end of the coupling 23 is further tightly inserted into the opening at the front shaft side of the inner bottle body 11.

In this embodiment, the coupling 23 has a coupling body with a hollow cylinder. The front shaft end of the coupling body is provided with an opening. Two liquid inlet holes 230 are configured on the peripheral sidewall of the coupling body at a position close to the rear shaft end thereof. The two liquid inlet holes are further open on the end surface of the rear shaft of the coupling body, and the two inlet holes 230 are symmetrically arranged. The outer layer sidewall of the coupling 23 radially extends outward to form a round of third protruding edge 231. The third protruding edge 231 divides the coupling 23 into a first segment and a second segment. The first segment is inserted into the rear shaft end of the brush sleeve base 20 and is engaged with the brush sleeve base (the implementation modes that can be adopted are as follows: a protrusion is configured on the outer sidewall of the first segment, and a recess to be engaged and matched with the protrusion is configured on the inner sidewall of the brush sleeve base). The second segment is tightly inserted into the opening at the front shaft side of the inner bottle body 11 in an engaging or screwing manner.

In this embodiment, the cap assembly 3 includes an outer cover 30, an inner sleeve 31, and a spring 32. The outer cover 30 and the inner sleeve 31 are both sleeve-shaped structures that are closed at the front shaft side and open at the rear shaft side. The inner sleeve 31 and the spring 32 are both arranged inside the outer cover 30. One end of the spring 32 is further sleeved on the inner surface of the front shaft side of the outer cover 30, which can be achieved by fixedly configuring a connecting block on the inner surface of the front shaft side of the outer cover. The other end of the spring 32 is further sleeved on the front shaft side of the inner sleeve 31.

In addition, the outer sidewall of the inner sleeve 31 radially extends outward to form a round of fourth protruding edge at a position close to the front shaft side of the inner sleeve 31. The inner sidewall of the outer cover 30 radially extends inward to form a round of first protrusion. The first protrusion can stop and block the fourth protruding edge to prevent the inner sleeve 31 from being detached from the outer cover 30.

Preferably, the outer cover 30 is sleeved outside the second portion of the brush sleeve base 20 and is engaged with the second portion of the brush sleeve base 20. Meanwhile, the front shaft side of the brush sleeve base 20 further extends into the inner sleeve 31 and abuts against the inner sidewall of the inner sleeve 31. Namely, the inner sleeve is in contact with the peripheral surface of the front shaft side of the brush sleeve base to realize the sealing. In addition, the engagement of the outer cover 30 with the second portion of the brush sleeve base 20 can be achieved by adopting the following specific implementation structures. A round of second protrusion is formed on the outer sidewall of the second portion of the brush sleeve base 20. A round of recess is disposed on the inner sidewall of the outer cover 30 at a position close to the rear shaft side thereof, and the second protrusion can be engaged with the recess. Alternatively, a round of recess may be configured on the outer sidewall of the second portion of the brush sleeve base, and a round of second protrusion is formed on the inner sidewall of the outer cover 30.

What is claimed is:

1. A liquid eyeliner pen having a liquid storage function, comprising a container assembly configured to contain an eyeliner liquid, an applying assembly configured to draw the eyeliner liquid to flow out and apply the eyeliner liquid onto a user's face, and a cap assembly; wherein the applying assembly comprises a brush sleeve base, a brush sleeve, a diverter base; a coupling, a liquid feeder, and a brush positioned and coupled to a shaft end of the liquid feeder; the brush sleeve base, the brush sleeve, the diverter base; and the coupling are coaxially arranged and are all sleeve-shaped structures with openings at both ends in an axial direction; a rear shaft end of the brush sleeve and a front shaft end of the coupling are correspondingly positioned and inserted into a front shaft end and a rear shaft end of the brush sleeve base, respectively; the diverter base is configured inside the brush sleeve base and is located between the brush sleeve and the coupling; two ends of the diverter base in the axial direction respectively abut against the rear shaft end of the brush sleeve and the front shaft end of the coupling; the brush sleeve, the diverter seat, and the coupling further collectively form an accommodating cavity; the liquid feeder and the brush are coaxially positioned and inserted into the accommodating cavity together, and a part of the brush further extends outside a front shaft end of the brush sleeve; an outer sidewall of the brush sleeve base radially extends outward to form a round of first protruding edge; the round of first protruding edge divides the brush sleeve base into a first portion corresponding to the coupling and a second portion corresponding to the brush sleeve; the first portion of the brush sleeve base is inserted into the container assembly and is detachably positioned and coupled with the container assembly; the cap assembly is detachably sleeved outside the second portion of the brush sleeve base; characterized in that the brush sleeve has a brush sleeve body, and the brush sleeve body is a sleeve-shaped structure with openings at both ends in the axial direction; at least one air inlet hole extending along the axial direction of the brush sleeve body and running through the brush sleeve body is configured on the brush sleeve body at a position close to a front shaft end thereof, and a front side of the air inlet hole is exposed outside the brush sleeve base; at least one first air vent extending along the axial direction of the brush sleeve body is further formed on an outer layer sidewall of the brush sleeve body; a front side of the first air vent intercommunicates with the air inlet hole; a rear side of the first air vent intercommunicates with a second air vent on the diverter base; and wherein at least one liquid storage groove unit is configured on an inner layer sidewall of the brush sleeve body; each liquid storage groove unit is composed of a plurality of arc-shaped liquid storage grooves extending along a circumferential direction of the brush sleeve body, and the plurality of arc-shaped liquid storage grooves of each liquid storage groove unit are further arranged along the axial direction of the brush sleeve body at intervals.

2. The liquid eyeliner pen having the liquid storage function according to claim 1, wherein two liquid storage groove units are provided; the plurality of arc-shaped liquid storage grooves of the two liquid storage groove units are symmetrically distributed around an axis line of the brush sleeve body; and two air inlet holes are provided, the two air inlet holes are matched with the two liquid storage groove units in a one-to-one correspondence; and a rear side of each air inlet hole extends to a front side of a corresponding liquid storage groove unit.

3. The liquid eyeliner pen having the liquid storage function according to claim 2, wherein two sides in a circumferential direction of each liquid storage groove unit are respectively provided with one of the air vent; front sides of the two air vents both intercommunicate with the air inlet holes corresponding to the liquid storage groove unit; and rear sides of the two air vents both intercommunicate with the second air vent located on the diverter base;

an arc-shaped intercommunicating hole extending along the circumferential direction of the brush sleeve body and running through the brush sleeve body is further configured on the brush sleeve body at a position of a rear side of each liquid storage groove unit; a rear side of each air vent intercommunicates with a corresponding arc-shaped intercommunicating hole; two cuttings are configured on the rear shaft end of the brush sleeve body, the two cuttings are matched with the two arc-shaped intercommunicating holes in a one-to-one correspondence, and the two cuttings intercommunicates with the two arc-shaped intercommunicating holes.

4. The liquid eyeliner pen having the liquid storage function according to claim 3, wherein the diverter base has a diverter base body; the diverter base body is a sleeve-shaped structure with openings at both ends in the axial direction; a plurality of annular grooves extending along a circumferential direction of the diverter base body are configured on an outer layer sidewall of the diverter base body; the plurality of annular grooves are arranged at equal intervals along the axial direction of the diverter base body; the second air vent axially extending along the diverter base body is configured on the outer layer sidewall of the diverter base body; and the second air vent further correspondingly intercommunicates with one of the cuttings;

a part of the annular grooves and the second air vent further intercommunicate with an inner cavity of the diverter base body.

5. The liquid eyeliner pen having the liquid storage function according to claim 2, wherein portions on the outer layer sidewall of the brush sleeve body between the two air inlet holes further radially extend outward to form an arc-shaped second protruding edge; wherein two of the second protruding edges are located on a same radial plane; and both of the second protruding edges are capable of abutting on an end surface of the front shaft of the brush sleeve base.

6. The liquid eyeliner pen having the liquid storage function according to claim 1, wherein the container assembly comprises an outer bottle body an inner bottle body, and an inner stopper; the outer bottle body is a cylindrical structure with an opening at the front shaft side; the inner bottle body is a sleeve-shaped structure with openings on both sides in the axial direction; the inner stopper is hermetically connected to the opening at a rear shaft side of the inner bottle body-(4-1-4; and the inner bottle body and the inner stopper are further coaxially and freely inserted into the outer bottle body;

the first portion of the brush sleeve base is inserted into the outer bottle body and is screwed with the outer bottle body; and a rear shaft end of the coupling is further tightly inserted into the opening at the front shaft side of the inner bottle body.

7. The liquid eyeliner pen having the liquid storage function according to claim 1, wherein the cap assembly comprises an outer cover, an inner sleeve, and a spring; the outer cover and the inner sleeve are both sleeve-shaped structures with closed front shaft side and open rear shaft side; the inner sleeve and the spring are both configured inside the outer cover; an end of the spring is further sleeved on an inner surface of a front shaft side of the outer cover; and an other end of the spring is further sleeved on a front shaft side of the inner sleeve;

a part of an outer sidewall of the inner sleeve at a position close to the front shaft side of the inner sleeve radially extends outward to form a round of fourth protruding edge; and an inner sidewall of the outer cover radially extends inward to form a round of first protrusion; the first protrusion is capable of stoppoing and blocking the round of fourth protruding edge.

8. The liquid eyeliner pen having the liquid storage function according to claim 7, wherein the outer cover is sleeved outside the second portion of the brush sleeve base and is engaged with the second portion of the brush sleeve base;

and the front shaft side of the brush sleeve base further extends into the inner sleeve and abuts against an inner sidewall of the inner sleeve.

\* \* \* \* \*